United States Patent [19]

Tanishi et al.

[11] Patent Number: 4,731,925

[45] Date of Patent: Mar. 22, 1988

[54] METHOD FOR PROVIDING A POWER CONNECTOR

[75] Inventors: Tokio Tanishi, Mie; Hideki Yokoyama, Tsu, both of Japan

[73] Assignee: Matsushita Electric Works, Ltd., Japan

[21] Appl. No.: 928,363

[22] Filed: Nov. 10, 1986

Related U.S. Application Data

[63] Continuation-in-part of Ser. No. 654,134, Sep. 25, 1984, abandoned.

[30] Foreign Application Priority Data

Sep. 30, 1983 [JP] Japan ................................ 58-184219

[51] Int. Cl.⁴ ................................................ H05K 3/34

[52] U.S. Cl. ........................................ 29/840; 200/296

[58] Field of Search ................. 29/840, 832, 835, 836, 29/837; 174/68.5; 248/DIG. 6

[56] References Cited

U.S. PATENT DOCUMENTS 3,432,802 3/1969 Ritchie ................................ 339/128
3,651,446 3/1972 Sadogierski et al. .
3,958,857 5/1976 Schultz et al. .
4,340,795 7/1982 Arthur .
4,406,936 9/1983 Ohashi ................................ 200/296
4,434,339 2/1984 Ohashi .
4,477,142 10/1984 Cooper et al. .

*Primary Examiner*—Howard N. Goldberg
*Assistant Examiner*—Carl J. Arbes
*Attorney, Agent, or Firm*—Stevens, Davis, Miller & Mosher

[57] ABSTRACT

A method for mounting an electrical receptacle between a printed circuit board and a parallel spaced front panel. A molded thermosetting plastic connector body holds a pair of contact terminals which have lugs projecting from the rear of the connector body which are secured to a printed circuit board. A front cover for the connector body is made of resilient thermoplastic material and has resilient ears and fingers to engage both an opening on the front panel and the connector body. Thus the connector body can first be placed on the circuit board, the front panel put in position and then the front cover snapped in place to hold the whole assembly together. The circuit may be a portion of a larger board.

3 Claims, 14 Drawing Figures

METHOD FOR PROVIDING A POWER CONNECTOR

RELATED APPLICATION

This application is a continuation-in-part of application Ser. No. 654,134, filed Sept. 25, 1984, and now abandoned.

BACKGROUND OF THE INVENTION

1. Field of the Invention

The present invention relates to a panel mounted electrical receptacle for a printed circuit board, and more particularly to an electrical receptacle adapted in use to be mounted at its rear on a printed circuit board and at its front on a parallel panel of an electric appliance incorporating the printed circuit board.

2. Description of the Prior Art

Electric receptacles for electric appliances, for example, phonographic equipment and the like have been recently required to be mounted both on a printed circuit board incorporated therein and on a covering panel thereof. To this end, prior receptacles have been designed to have terminal lugs projecting on the rear end thereof, these lugs are to be electrically and mechanically connected to the printed circuit board and also designed to have an integral flange to be in abutting engagement with the outside edge of a mount opening formed in the panel. This construction requires for mounting that the receptacle firstly be inserted through the mount opening from the front of the panel for positioning the receptacle on the panel and thereafter to have the terminal lugs connected to the printed circuit board. In other words, the connection between the receptacle and the printed circuit board is possible only after inserting the receptacle in the panel from the front thereof, which results in reduced flexibility for the above connecting operation and is therefore inconvenient. Accordingly, it is more desirable to mount the electrical receptacle to the printed circuit board prior to being mounted on the panel.

SUMMARY OF THE INVENTION

The above inconvenience has been eliminated by the present invention which comprises a method of utilizing a connector body having therein contact terminals and a separable cover to be attached thereto. Contact terminals are disposed in the connector body with their rear end portions projecting out of the rear end of the connector body so as to define at the respective rear end portion terminal lugs which are adapted to be electrically and mechanically connected to a printed circuit board. The cover through which mating contacts of a cooperative plug extend to be connected to said contact terminals is added to the connector body from the outer of the panel and through a mount opening in the panel which forms a part of a casing incorporating the above printed circuit board. Provided at the front portion of the cover is a peripheral flange which is adapted to engage against the front edge of the mount opening. Connection between the cover and the connector body is made by latch tabs extending rearwardly from the cover to extend through said mount opening for engagement with cooperative latch ears provided on the connector body. Thus, the receptacle can be mounted on the panel at the time of connecting the cover to the connector body which is already mounted on the printed circuit board, allowing the connector body to be connected to the printed circuit board prior to being mounted on the panel. With this result, the connector body can be previously attached to the printed circuit board without being restricted by the panel and therefore be easily mounted on the printed circuit board in just the same way and preferably at the same time as other electric components such as resistors, capacitors, etc.

Accordingly, it is a primary object of the present invention to provide a panel mounted electrical receptacle for printed circuit boards which can be easily mounted on a printed circuit board prior to being mounted on a panel and a method of so mounting.

In a preferred embodiment, each of said latch tabs is formed to have an aperture into which a corresponding latch ear is fitted for engagement therebetween. Each latch tab is therefore required to a resilient member capable of flexing for enabling the above fitting connection between the latch ear and the latch tab. In the meanwhile, receptacles having therein the contact terminals are required for safety purposes to be made of heat-resistive material such as thermosetting plastic material, for example, urea resin or melamine resin. However, such thermosetting plastic materials have proved to have less inherent resiliency and therefore are not suitable for the above latch tabs, while thermoplastic materials have greater inherent resiliency sufficient for the latch tabs althrough they are not heat-resistive. The present invention also satisfies the above two requirements of inconsistent nature, since the receptacle is divided into two separate members which can be made of different materials. That is, the connector body incorporating the contact terminals can be made of a suitable thermosetting material for heat resistive purpose while the cover with the latch tabs can be made of a suitable thermoplastic material for imparting enough resiliency to the latch tabs.

It is therefore another object of the present invention to provide a panel mounted electric appliance for printed circuit boards which ensures resilient engagement between the latch tabs of the cover and the latch ears on the connector body while assuring heat-resistive construction required for the connector body having therein the connector terminals.

Another object of the present invention is to provide a method of connecting such receptacles by mounting the electrical receptacle to a section of a printed circuit board; that section can be separated from the remainder of the board after soldering thereto, attaching the connector body to the front cover and utilizing the separated remainder of the printed circuit board in the electrical appliance being assembled.

These and other objects and advantages will be more apparent from the following detailed description of a preferred embodiment of the invention when taken in conjunction with the accompanying drawings.

DETAILED DESCRIPTION OF THE PREFERRED EMBODIMENTS

Figure 1:
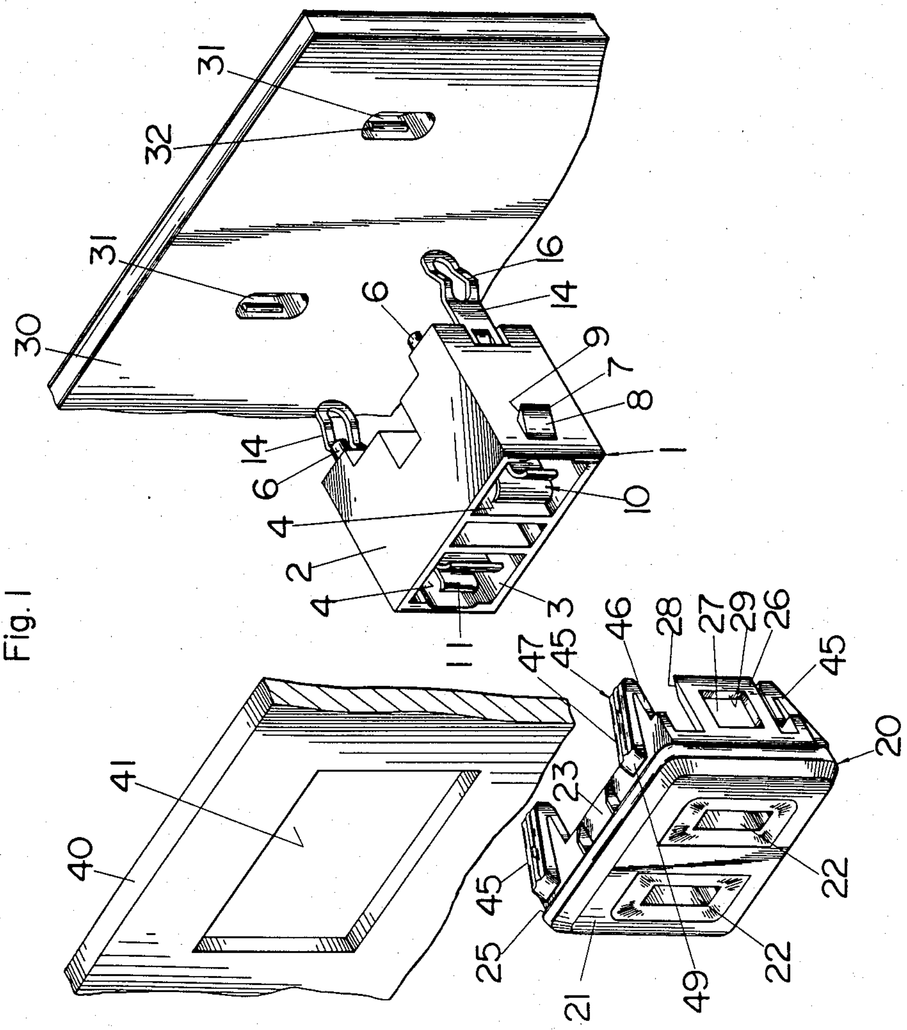
FIG. 1 is an exploded perspective view of a panel mounted electrical receptacle in accordance with a preferred embodiment of the present invention.

Referring now to FIG. 1, a panel mounted electrical receptacle for a printed circuit board comprises a connector body 1 having therein a pair of contact terminals 10 and a front cover 20 attachable thereto. The receptacle disclosed in the present embodiment is of the type utilized as an output socket receiving a plug (not shown) with contact blades. The connector body 1 includes a housing 2 made of electrically insulative and heat resistant thermosetting plastic material, for example, melamine phenol resin or urea resin. The housing 2 has a generally prismatic configuration with a rectangular shaped front opening 3 which communicates with two recessed chambers 4 in the housing 2, said recessed chambers 4 fixedly receiving therein said contact terminals 10, respectively, as shown in FIG. 2.

Figure 3:
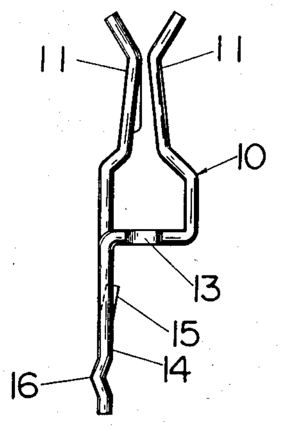
FIG. 3 is a front elevation of one of the contact terminals received in the connector body.
Figure 7:
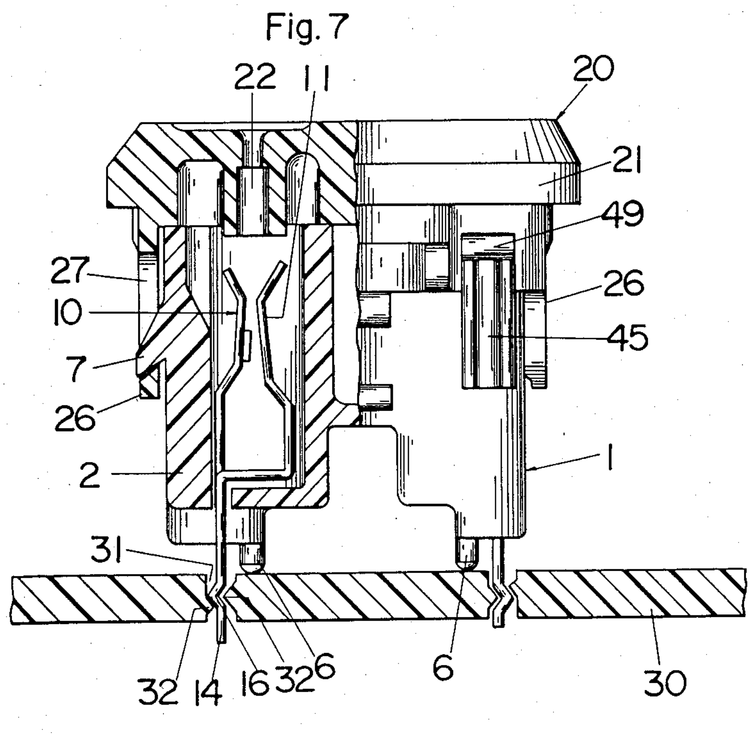
FIG. 7 is a front elevation, partly in section, of the receptacle when mounted on a printed circuit board.
Figure 8:
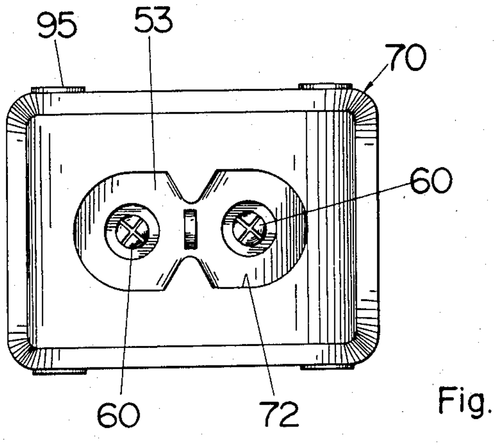
FIG. 8 is a top view of a panel mounted electrical receptacle in accordance with another preferred embodiment of the present invention.

As shown in FIG. 3, each contact terminal 10 is of unitary sheet metal construction and shaped to have at its front end portion a pair of prongs 11 forming a female contact spring for receiving one of said contact blades of the plug. An intergral terminal lug 14 extends rearwardly from a base portion 13 of each female contact spring at a right angle thereto. The contact terminals 10 thus constructed are fixedly received respectively in said recessed chambers 4 with their base portions 13 being against the bottoms of the chambers and with the terminal lugs 14 extending rearwardly through respective slots 5 in the rear end of the housing 2. Formed at the portion of each terminal lug 14 and projecting beyond the rear end of the housing 2 is a lanced and inwardly bent tang 15 which engages the rear end surface of the housing 2 to fix the contact terminal 10 in position. Each of the terminal lugs 14 has its end portion twice bent to form thereat a V-shaped projection 16 which is to be inserted in a suitable hole 31 in a printed circuit board 30 and is connected thereto by soldering, as shown in FIG. 7. Thus, the terminal lugs 14 serves to mount the connector body 1 on the printed board 30 by electrically connecting the contact terminals 10 thereto. As seen from FIG. 7, each of said V-shaped projections 16 is cooperative with staggered pegs 32 in the corresponding hole 31 to retain the connector body 1 on the printed circuit board 30 before soldering, facilitating the mounting of the connector body 1. A plurality of studs 6 are formed on the rear end of the housing 2 adjacent to the respective terminal lugs 14 to abut against the printed circuit board 30 for providing a clearance between the housing 2 and the printed circuit board 30, such clearance preventing the entry of flux at the time of soldering into the interior of the housing 2 through said slots 5.

Figure 2:
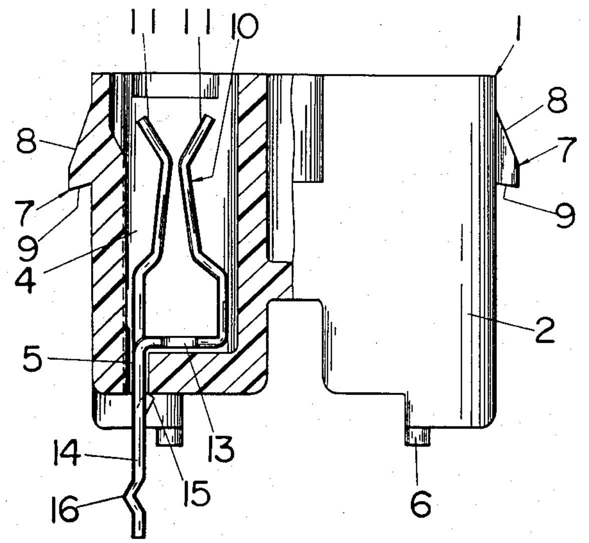
FIG. 2 is a front elevation, partly in section, of a connector body for the above receptacle.

Integrally formed on the opposite sides of the housing 2 are latch ears 7 with a generally triangle sloping cam surface 8 terminating in an inclined latching shoulder 9 which is at a steep angle with respect to the side surface of the housing 2, as best shown in FIG. 2.

Figure 4:
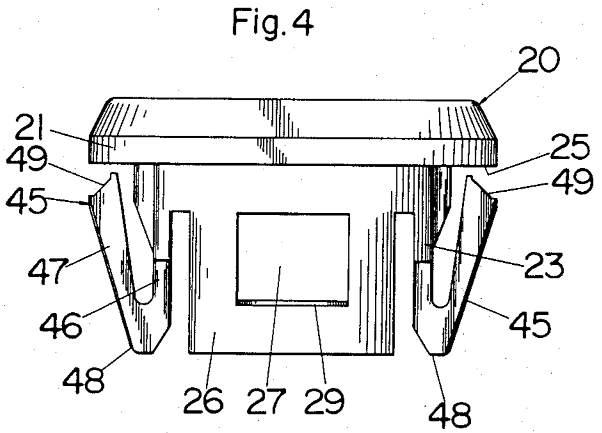
FIG. 4 is a side elevation of a front cover of the above receptacle.
Figure 5:
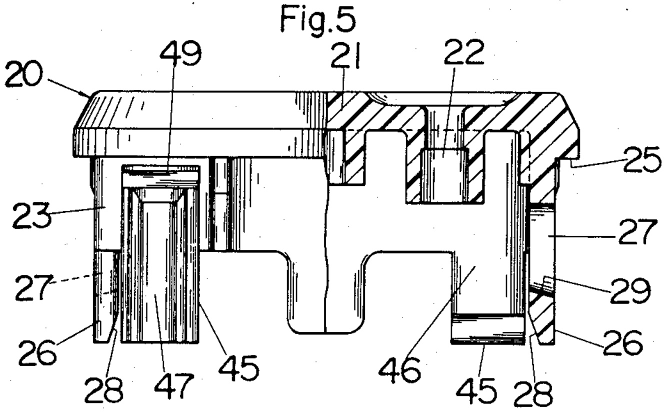
FIG. 5 is a front elevation, partly in section, of the front cover of FIG. 4.

As shown in FIGS. 4 and 5, the front cover 20 is made of a thermoplastic material, for example, polyphenylene oxide (PPO) or polybutylene terephthalate and comprises a plate section 21 with laterally spaced windows 22 through which the contact blades of the plug are inserted for connection with the contact terminals 10 in the connector body 1. The front cover 20 is to be coupled to said connector body 1 mounted on the printed circuit board 30 through a mount opening 41 (see FIG. 1) formed in a panel 40 constituting a part of a casing enclosing said printed circuit board 30 together with other associated components. A pair of end walls 23 extend rearwardly from the plate section 21 to define therebetween a space for receiving the front portion of said connector body 1. A peripheral flange 25 is defined on the rear surface of the plate section 21 outside of said end walls 23 and is adapted to engage against the front edge of the mount opening 41 when the cover 20 is coupled to the connector body 1. Extending rearwardly respectively from the opposite sides of the plate section 21 are a pair of integral latch tabs 26 each having a rectangular aperture 27. Each of the latch tabs 26 has inherent resiliency due to the material of the cover 20 so as to be allowed to flex outwardly during assembly after which it is resiliently urged inwardly into locked engagement with the one of said latch ears 7. That is, during the insertion of said connector body 1 or the housing 2 into the space surrounded by said end walls 23 and the latch tabs 26 of the front cover 20, the cam surface 8 of each latch ear 7 firstly engages against a bevelled brim 28 at the inner edge portion of each latch tab 26 outwardly to be snapped in the aperture 27 in which position, as best shown in FIG. 7, the latch tab 26 is resiliently urged inwardly to have a bevelled edge 29 at the rear periphery of the aperture 27 in locking engagement with said latching shoulder 9 of the latch body 1 and the front cover 20. The above locking engagement between the bevelled edge 29 and the latching shoulder 9 provides a greater resistivity against an attempt to disassemble the cover 20 from the connector body 10.

Figure 6:
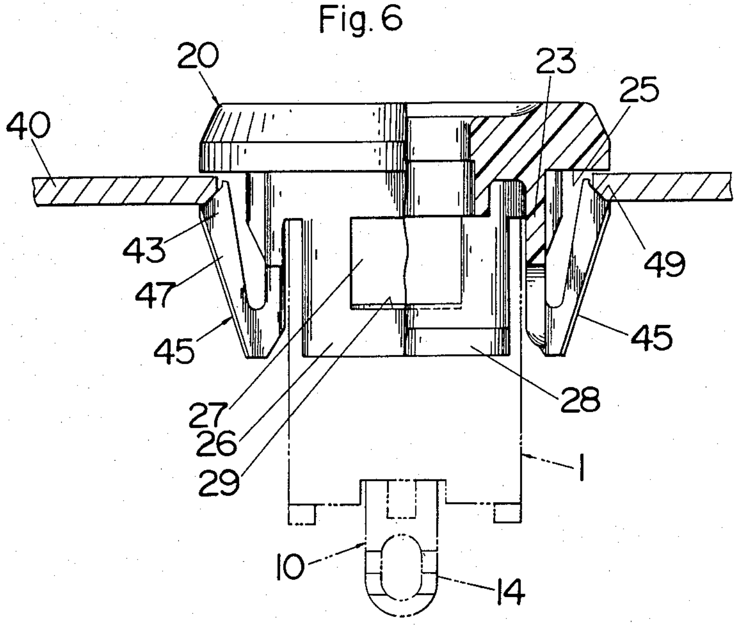
FIG. 6 is a side elevation, partly in section, of the front cover when mounted on a panel.

Also extending rearwardly from the front cover 20 are generally U-shaped latch fingers 45 which are integral therewith and are located respectively at four corner portions on the rear surface of said plate section 21 but at the portions inwardly of said peripheral flange 25. Each of the latch fingers 45 is composed of a support rib 46 and a resilient bow 47 connected thereto at 48 and upturned therefrom so as to be outside and next to the support rib 46, the support rib 46 merging integrally into one of said end walls 23 at the sideward end portion thereof and the resilient bow 47 being formed at its free end with a bevelled latching edge 49. The front cover 20 thus formed can be attached to said panel 40 by inserting the latch fingers 45 together with the latch tabs 26 through the mount opening 41 during which insertion the resilient bows 47 are forced to flex inwardly to pass through the mount opening 41 and after which they are resiliently urged outwardly to have the bevelled latching edges 49 thereof in locking engagement against a rear chamfered edge 43 of the mount opening 41, as shown in FIG. 6 to thereby mount the cover 20 fixedly on the panel 40. Thus, the mounting of the cover 20 on the panel 40 can be done at the same time as coupling the cover 20 to the connector body 1 which has already been mounted on a portion of the printed circuit board 30, facilitating the assembly of the receptacle on the panel. Of course, the cover 20 is preferably attached to the panel 40 before it is coupled to the connector body 1 as required.

Figure 9:
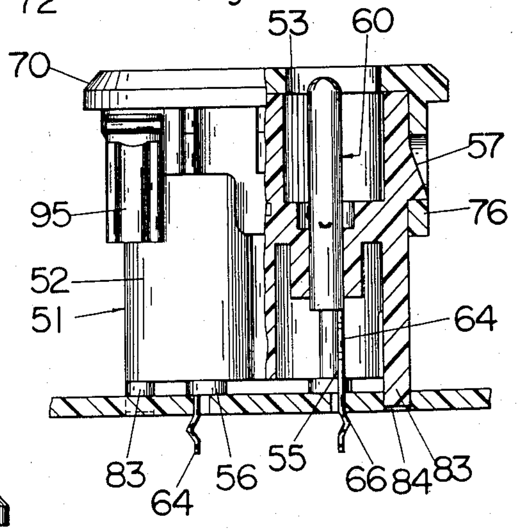
FIG. 9 is a front elevation, partly in section, of the receptacle when mounted on a printed circuit board.
Figure 12:
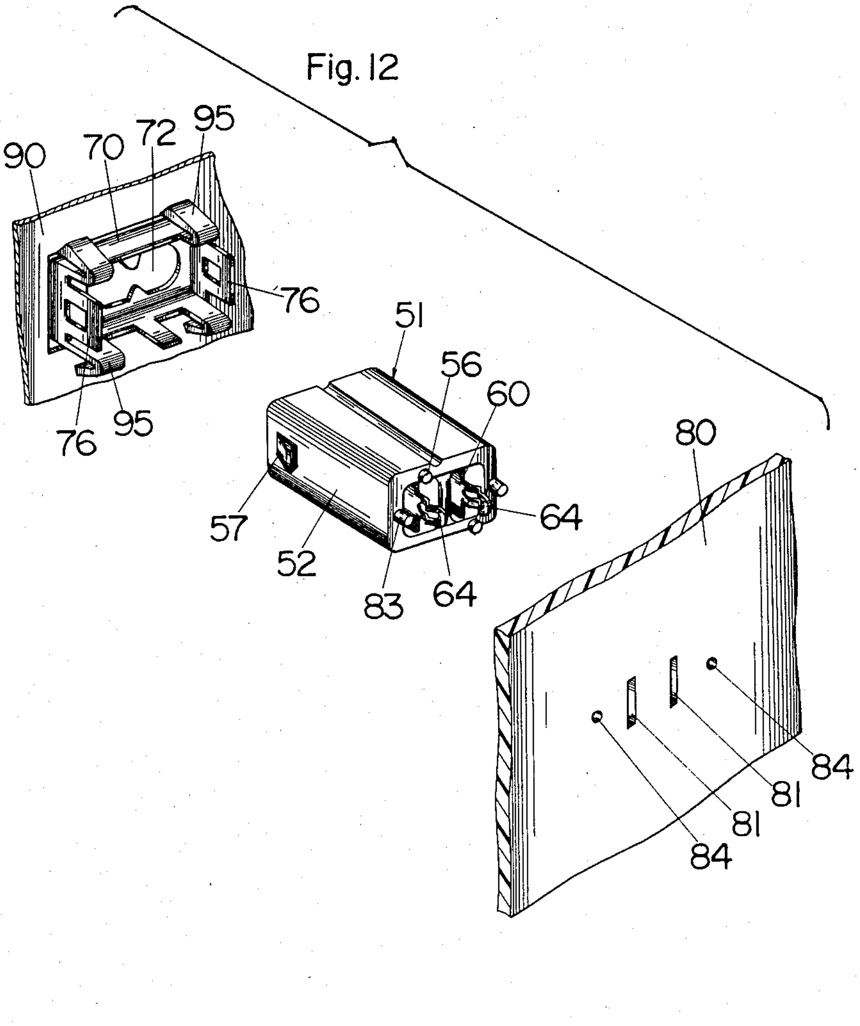
FIG. 12 is an exploded view of the receptacle, the panel and a portion of a printed circuit board.

FIGS. 8 to 12 show another preferred embodiment of the present invention which is similar to the above embodiment except the contact arrangements. A connector body 51 is designed as an input socket for receiving a complementary plug (not shown) with female contact members and accordingly has contact terminals 60 in the form of male or pin contacts to be inserted in said female contact members. Each contact terminal 60 is of unitary sheet metal construction and has its front portion shaped or bent into a generally cylindrical configuration defining said pin contact and has its rear portion shaped into a generally flat member serving as a terminal lug 64. The contact terminals 60 are fixedly inserted in respective slots 55 in a housing 52 of the connector body 51 with the pin contact portions thereof projecting into a front opening 53 in the housing 52 in laterally spaced relationship with one another. The terminal lug 64 at the rear end of each contact terminal 60 projects beyond the rear end of the housing 52 so as to be inserted into respective holes 81 in a printed circuit board 80, as shown in FIG. 12, for being electrically and mechanically connected thereto by soldering. FIG. 12 shows one example of mounting the connector body 51 on the printed circuit board 80 in which mounting posts 83 integrally projecting on the rear end of the housing 52 fit in corresponding eyes 84 formed in the printed circuit board 80 at the same time V-shaped projections 66 (as seen in FIG. 9) at the free end portions of the terminal lugs 64 extend through the holes 81 to engage against the underside of the printed circuit board 80, whereby the connector body 51 can be held in position until it is finally connected to the board 80 by soldering. A plurality of studs 56 project from the rear end surface of the housing 52 to abut against the upper surface of the printed circuit board 80 for providing therebetween a clearance which acts to prevent the entry of flux at the time of soldering.

Figure 10:
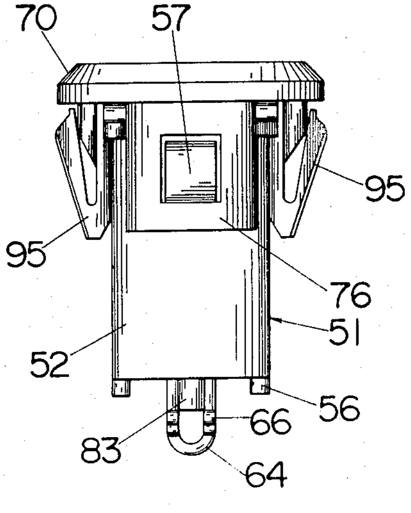
FIG. 10 is a side elevation of the receptacle.
Figure 11:
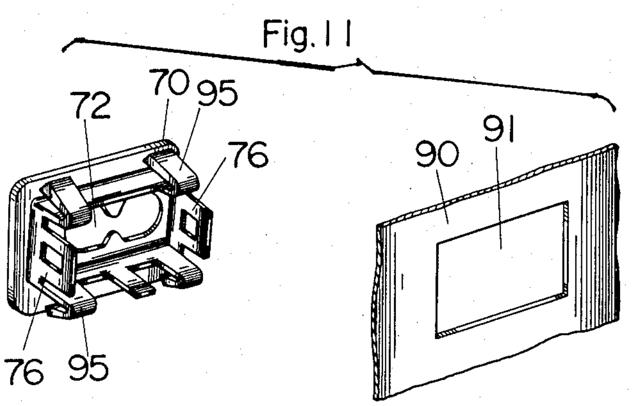
FIG. 11 is an exploded view showing a front cover of the receptacle and a panel on which it is to be mounted.

Referring now to FIGS. 9 and 10, a front cover 70 has a wide window through which the plug extends into said front opening 53 of the housing 52 of the connector body 51. Other members of the cover 70, including latch tabs 76 and latch fingers 95, are shaped in the same configuration as in the foregoing embodiment. Accordingly these members 76 and 95 are in resilient engagement respectively with latch ears 57 on the housing 52 of the connector body 51 and with the edge portion of a mount opening 91 formed in a panel 90, in just the same manner as the foregoing embodiment.

From the foregoing it is clear that according to the method of the present invention the connector body 51 can first be secured to a printed circuit board 80 or a portion thereof and the connector body 51, with the printed circuit board attached, can subsequently be attached to a front cover 70 which is already in a mount opening 91 of a panel 90. This sequence is shown, for example, in FIG. 12 which, although used to illustrate the second embodiment, is also applicable to illustrate the method in connection with the first embodiment.

Figure 13:
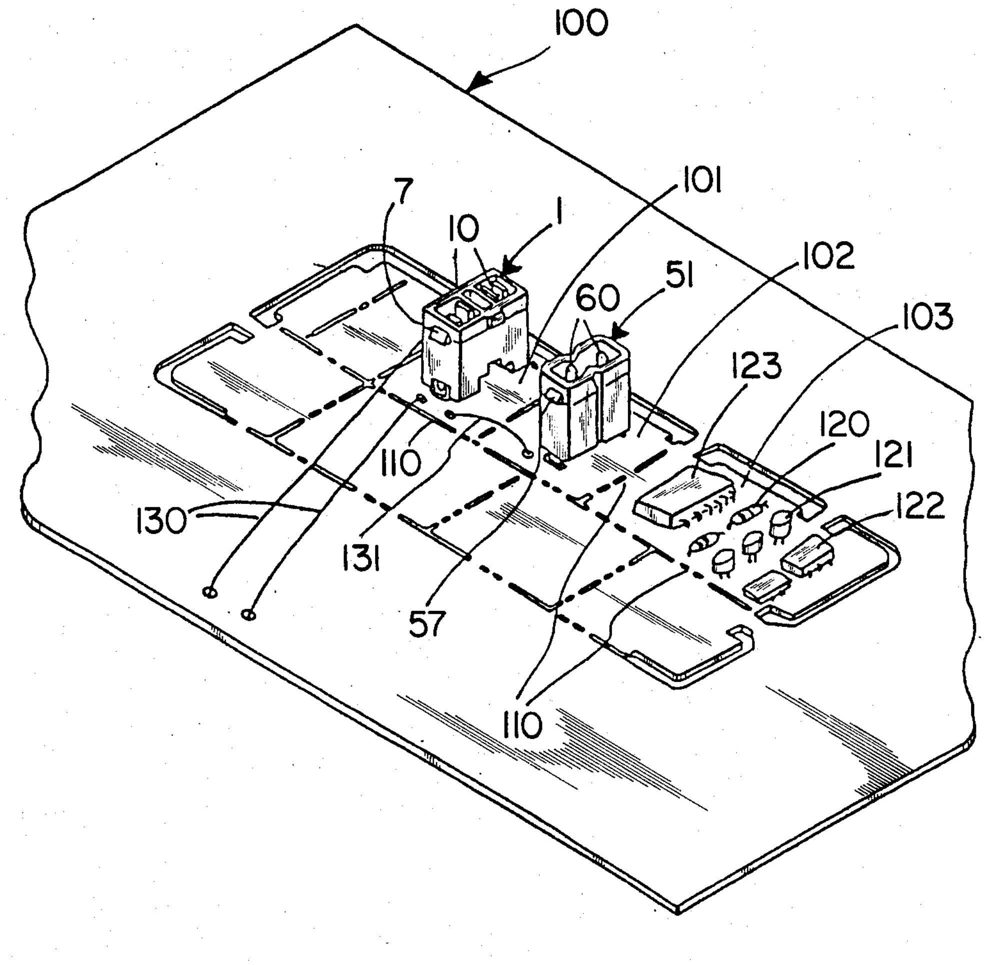
FIG. 13 is an overall perspective view of a printed circuit board having components mounted thereon and having a plurality of separable sections, these sections being separable from each other along weakened or perforated lines.
Figure 14:
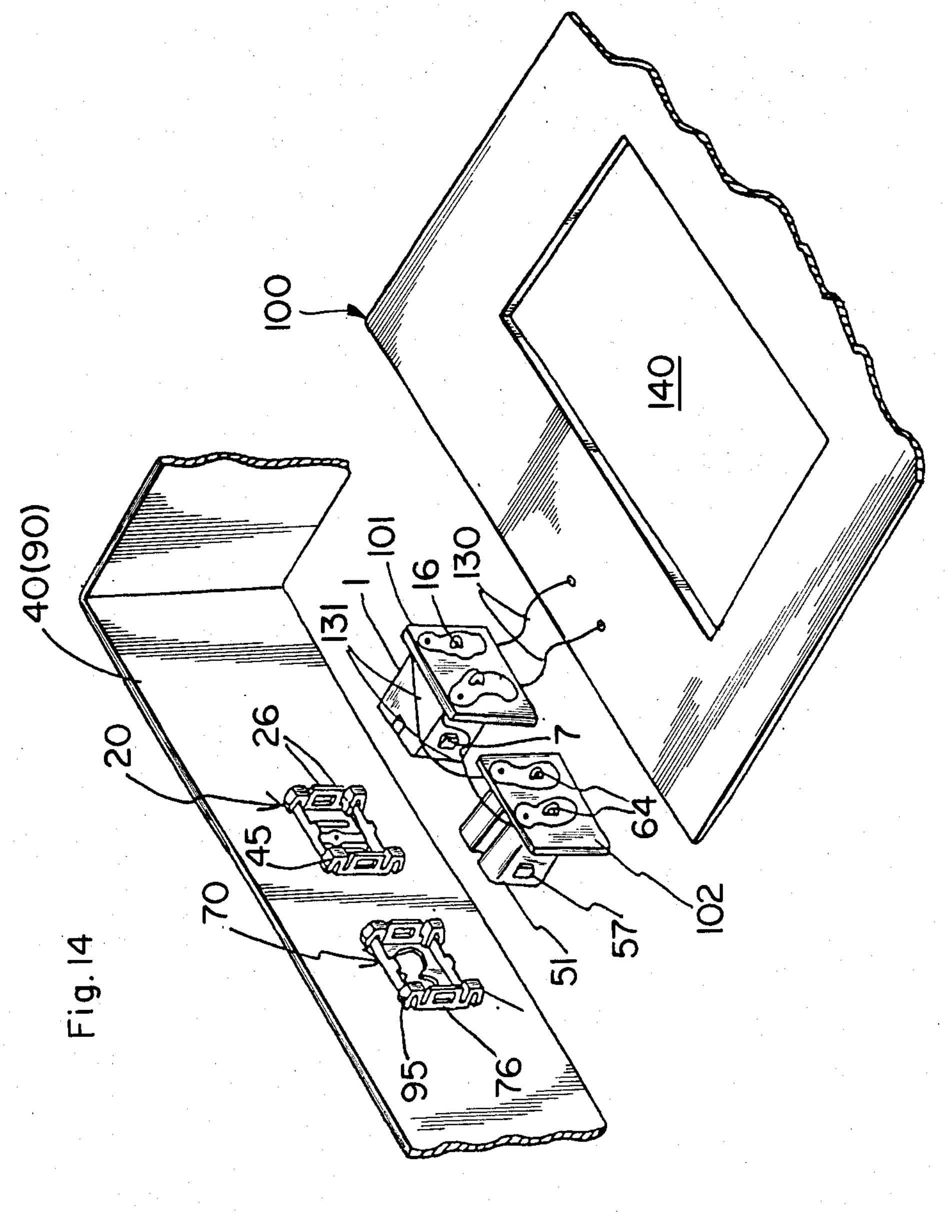
FIG. 14 is a perspective view showing a front panel ready to receive two electrical connectors with portions of printed circuits attached thereto; the remainder of the printed circuit board from which the portions were detached is also shown.

FIGS. 13 and 14 illustrate the previously disclosed method in greater detail, particularly showing a printed circuit board 100 which has a plurality of separable sections 101, 102 and 103 for mounting different parts. The separable sections 101–103 may be disconnected from the remainder of the board along weakened or perforated lines 110 so as to be separate from each other and from the remainder of the board 100.

As further shown in FIG. 13, a plurality of other electrical components, such as resistors 120, capacitors 121, transistors 122 or integrated circuits (IC's) 123 may be attached to the same or adjacent separable portion of the printed circuit board so as to be used in and incorporated into the housing of an electrical appliance. Portions of the separable circuit board which will be later physically separated but are to remain electrically connected may for convenience, while the printed circuit board portions are still together, be electrically connected by means of jumper wires 130 and/or 131. Thus all of the connections to be soldered are together in a convenient form ready to be soldered at one time. That is, the connector body 1, 51 of the receptacle can be placed together with the electric components on the printed circuit board 100 and soldered to the circuit of the board by using the same soldering technique. This eliminates the conventional batch process of soldering the receptacle on the printed circuit board separately from the other electric components and consequently allows an automated mounting of the receptacle and the other electric components 120–123 on the printed circuit board 100, which is most suited to automated assembly. For example, a flow soldering technique can be utilized for simultaneous mounting of the receptacle, i.e., connector body 1, 51 and the other electric components 120–123 on the printed circuit board in an automated line.

Thus the present method may be summarized as follows: using at least one combination receptacle and a printed circuit board 100 carrying electric components 120–123 for the appliance comprises the steps of:

placing the connector body 1, 51 and electrical components 120–123 on complementary sections 101–103 respectively of the printed circuit board 100;

soldering the connector body 1, 51 and the electrical components 120–123 respectively to the circuits of the sections 101–103 for simultaneous mounting thereof on the respective sections of printed circuit board;

removing the connector body 1, 51 together with the printed circuit board sections 101 and 102 and mounting the same as an integral unit which is separate from the rest of printed circuit board 100;

attaching the connector body 1, 51 to the front cover 20, 70 mounted on the panel 40, 90 so as to complete the assembly of the electrical receptacle, and, optionally utilizing the printed circuit board 100 upon which the sections 101 and 102 mounting the connector body 1, 51 was located as the circuit board to be assembled into a housing of the electric appliance.

Since the section 101 and 102 mounting the connector body 1 or 51 has its circuit connected to the rest of the printed circuit board by way of the jumper lines 130 or 131, the section 101 or 102 is kept electrically connected to the printed circuit board 100 after removing the connector body together with the section upon which it is mounted from the printed circuit board 100. Thus, no further wiring is required between the receptacle and the printed circuit board after assembling the receptacle to the panel 40 or 90 of the electric appliance, thus eliminating the necessity of such wiring which would be otherwise required and be difficult in a confined space.

The opening 140 formed in the printed circuit board 100 after removing the sections 101 and 102 can be better utilized as a mounting space for another electric device such as a transformer and the like of relatively bulky configuration. In this sense, the entire dimensions of the printed circuit board is effectively utilized for mounting the components for the electric appliance.

It should also be noted that, as shown in the drawings, two types of receptacles, i.e., input and output connectors 1, 51, are mounted on the individual sections 101 and 102 separable from each other and from the printed circuit board while electrically connected with each other by way of jumper line 131. Thus, the output connector 1 is electrically connected to the rest of the printed circuit board 100 by way of the jumper lines 130.

The foregoing is given by way of disclosure of a preferred embodiment, it being understood that the scope of protection is defined by the following claims.

What is claimed is:

1. A method for providing a power connector on a panel of an electrical appliance by using at least one combination receptacle and a printed circuit board carrying electric components for the appliance; said combination receptacle comprising a connector body, a front cover separately formed therefrom and attachable thereto, said connector body having therein fixed contact terminals for contacting engagement with mating contacts of an electrical plug, each contact terminal projecting rearwardly of the connector body to define a terminal lug by which the connector body is to be supported on the printed circuit board, said front cover having mount means by which it is mounted to a mount opening in the panel of the electric appliance, said front cover having snap means by which it is snappedly attached to the connector body; and said printed circuit board being provided with a plurality of sections delimited by weakening lines and separable therealong from the rest of the printed circuit board;

said method using the above receptacle and the printed circuit board comprising the steps of:

placing the connector body and the electrical components on complementary sections respectively of the printed circuit board;

soldering the connector body and the electrical components respectively to the circuits of the sections for simultaneous mounting thereof on the respective sections of the printed circuit board;

removing the connector body together with the section of the printed circuit board mounting the same as an integral unit from the rest of the printed circuit board;

attaching the connector body to the front cover mounted on the panel so as to complete the assembly of the electrical receptacle, and utilizing the printed circuit board upon which the section mounting the connector body is located as the circuit board to be assembled into a housing of the electric appliance.

2. A method for providing a power connector on a panel or an electrical appliance by using a combination receptacle and a printed circuit board carrying the electrical components of the electrical appliance as set forth in claim 1, including connecting the connector body electrically to the circuit for which it is intended by the use of jumper lines to the rest of the printed circuit board.

3. A method for providing a power connector on a panel of an electrical appliance by using a combination receptacle and a printed circuit board as set forth in claim 1, including removing the sections mounting the connector body to form an opening for supporting another electric device required for the assembly of the electrical appliance.

* * * * *